United States Patent
Nagase

(10) Patent No.: US 7,294,872 B2
(45) Date of Patent: Nov. 13, 2007

(54) SOLID STATE IMAGE PICKUP DEVICE AND ITS MANUFACTURE METHOD

(75) Inventor: Masanori Nagase, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 47 days.

(21) Appl. No.: 11/378,303

(22) Filed: Mar. 20, 2006

(65) Prior Publication Data

US 2006/0157837 A1   Jul. 20, 2006

(51) Int. Cl.
*H01L 27/148* (2006.01)
*H01L 21/00* (2006.01)

(52) U.S. Cl. ............... 257/222; 257/223; 257/231; 257/E27.151; 257/E21.457; 438/60; 438/75

(58) Field of Classification Search ............... 257/222, 257/223, 230, 231, 233, 242, E27.151, E27.154, 257/E21.457; 438/60, 75, 78, 79
See application file for complete search history.

(56) References Cited

U.S. PATENT DOCUMENTS

| | | | |
|---|---|---|---|
| 5,492,852 A | | 2/1996 | Minami |
| 5,956,570 A | * | 9/1999 | Takizawa ............... 438/60 |
| 5,981,309 A | | 11/1999 | Kim et al. |
| 6,084,273 A | | 7/2000 | Hirota |
| 6,252,265 B1 | | 6/2001 | Hatano et al. |
| 6,333,525 B1 | | 12/2001 | Furumiya |

(Continued)

FOREIGN PATENT DOCUMENTS

EP   0 492 144 A2   11/1991

(Continued)

OTHER PUBLICATIONS

International Search Report dated Oct. 13, 2005.

*Primary Examiner*—T. N. Quach
(74) *Attorney, Agent, or Firm*—McGinn IP Law Group, PLLC

(57) ABSTRACT

PROBLEM To provide a high quality solid state image pickup device. SOLUTION Impurities are implanted into a semiconductor substrate to form vertical transfer channels for transferring electric charges in a first direction and to form a drain near each of the vertical transfer channels via a gate which forms a barrier. A first silicon oxide film, a silicon nitride film and a second silicon oxide film are deposited in this order from the bottom, on the surfaces of the vertical transfer channels, gates and drains. A first layer vertical transfer electrode is formed on the second silicon oxide film above the vertical transfer channel, and an insulating film if formed on the surface of the first layer vertical transfer electrode. The second silicon oxide film and silicon nitride film are etched in such a manner that the silicon nitride film covers the vertical transfer channel and extends above the gate excepting a portion near the drain. A gate control electrode is formed on the insulating film and first silicon oxide film. A plurality of charge accumulation regions are formed in a matrix shape in an area defined on an upstream side of the first direction further than the drains, in such a manner that each column of the charge accumulation regions is formed near each of the vertical transfer channels.

25 Claims, 10 Drawing Sheets

U.S. PATENT DOCUMENTS

| | | | |
|---|---|---|---|
| 6,765,246 B2 * | 7/2004 | Inagaki | 257/223 |
| 6,929,972 B2 * | 8/2005 | Takeuchi et al. | 438/70 |
| 6,946,694 B2 * | 9/2005 | Okamoto et al. | 257/222 |
| 7,050,101 B2 * | 5/2006 | Wako et al. | 348/314 |
| 2002/0171102 A1 | 11/2002 | Shizukuishi | |
| 2006/0043511 A1 * | 3/2006 | Nomura et al. | 257/432 |

FOREIGN PATENT DOCUMENTS

| | | |
|---|---|---|
| EP | 2001-111027 | 4/2001 |
| EP | 1 289 019 A2 | 8/2002 |
| JP | 2003-332556 | 11/2003 |

* cited by examiner

SOLID STATE IMAGE PICKUP DEVICE AND ITS MANUFACTURE METHOD

TECHNICAL FIELD

The present invention relates to a solid state image pickup device and its manufacture method, and more particularly to a solid state image pickup device having the structure that an insulating film above a gate next to a charge sweeping drain has therein a nitride film and to its manufacture method.

BACKGROUND ART

FIG. 7A is a block diagram showing a main portion of a solid state image pickup apparatus assembling a solid state imaging pickup device, and FIGS. 7B and 7C are schematic plan views showing the structure of the solid state image pickup device. FIG. 7D is a schematic cross sectional view showing a portion of a pixel area of a solid state image pickup device.

Referring to FIG. 7A, the structure of a solid state image pickup apparatus will be described. A solid state imaging pickup device 51 generates signal charges corresponding to an amount of light incident upon each pixel and supplies an image signal corresponding to the generated signal charges. A drive signal generator 52 generates drive signals (transfer voltage, etc.) for driving the solid state image pickup device 51 and supplies them to the solid state image pickup device 51. An analog front end (AFE) 53 subjects an output signal from the solid state imaging unit 51 to correlation double sampling, amplifies the sampled signal at an externally set gain, converts it into a digital signal, and outputs the digital signal. A digital signal processor (DSP) 54 processes an image signal supplied from the analog front end 53, such as recognition process, data compression and network control, and outputs the processed image data. A timing generator (TG) 55 generates timing signals for the solid state image pickup device 51, drive signal generator 52 and analog front end 53, to control the operations thereof. The drive signal generator 52 includes, for example, a V driver for generating a vertical charge coupled device (CCD) drive signal. Signals supplied from the drive signal generator 52 to the solid state image pickup device 51 include a horizontal CCD drive signal, a vertical CCD drive signal, an output amplifier drive signal and a substrate bias signal.

As shown in FIG. 7B, the solid state image pickup device is constituted of: a plurality of photosensors 62 disposed, for example, in a matrix shape; a plurality of vertical CCDs 64 disposed near each column of the photosensors 62; a horizontal CCD 66 electrically connected to the vertical CCDs 64 via a V drain area 68; and an amplifier circuit 67, connected to an output terminal of the horizontal CCD 66, for amplifying an output charge signal from the horizontal CCD 66. A pixel area 61 is constituted of the photosensors 62 and vertical CCDs 64.

The photosensor 62 is constituted of a photosensitive element, e.g., a photoelectric conversion element (photodiode) and a read gate. The photoelectric conversion element generates signal charges corresponding to an incidence light amount and accumulates them. Reading the accumulated signal charges to the vertical CCD (vertical transfer channel) 64 is controlled by a voltage applied to the read gate. The signal charges read to the vertical CCD 64 are transferred in the vertical CCDs (vertical transfer channel) 64 toward the horizontal CCD 66 (in a vertical or column direction).

Signal charges transferred from the bottom ends of the vertical CCDs 64 via a V drain area (vertical CCD drain area) 68 are transferred in the horizontal CCD (horizontal transfer channel) 66 in a horizontal direction (called also row direction), amplified by the amplifier circuit 67 and output to an external. The V drain area 68 has drains 95 and will be later described in detail.

The photosensors 62 are disposed in a square matrix layout at a constant pitch in the row and column directions as shown in FIG. 7B, or disposed in a honeycomb layout in the row and column directions by shifting every second photosensors, for example, by a half pitch.

FIG. 7C is a schematic plan view of a solid state image pickup device having the honeycomb layout. The honeycomb layout has photosensors 62 disposed in a first square matrix layout and photosensors 62 disposed in a second square matrix layout at positions between lattice points of the first square matrix layout. Vertical CCDs (vertical transfer channels) 64 are disposed in a zigzag way between photosensors 62. Although this layout is called a honeycomb layout, the photosensor 62 of most honeycomb layouts is octangular.

As shown in FIG. 7D, formed in a p-type well 82 formed in a semiconductor substrate 81, e.g., an n-type silicon substrate, are a charge accumulation region 71 made of an n-type impurity doped region, a $p^+$-type buried region 71a formed on the photoelectric conversion element, and a vertical transfer channel 73 made of an n-type region disposed next to the photoelectric conversion element and buried region. The n-type charge accumulation region 71 and an underlying p-type region constitute a photoelectric conversion element. The photoelectric conversion element generates signal charges corresponding to an incidence light amount. The generated signal charges are accumulated in the charge accumulation region 71. A read gate 72 is defined between the charge accumulation region 71 and vertical transfer channel 73. A vertical transfer electrode 75 is formed above the vertical transfer channel 73, with an insulating film 74 being interposed therebetween. A p-type channel stop region 76 is formed between adjacent charge accumulation regions 71.

The channel stop region 76 is used for electrically isolating the charge accumulation regions 71, vertical transfer channels 73 and the like. The insulating film 74 is a silicon oxide film formed on the surface of the semiconductor substrate 81, for example, by thermal oxidation. The vertical transfer electrode 75 is constituted of first and second vertical transfer electrodes made of, for example, polysilicon. The first and second vertical transfer electrodes may be made of amorphous silicon. In accordance with voltages (drive signals) applied to the vertical transfer electrode 75, signal charges are transferred in the vertical transfer channel 73. The vertical transfer electrode 75 above the read gate 72 has also the function of reading signal charges accumulated in the charge accumulation region 71, from the read gate 72 to the vertical transfer channel 73 in accordance with an applied voltage (drive signal). An insulating silicon oxide film 77 is formed on the vertical transfer electrode 75, for example, by thermally oxidizing polysilicon. The vertical CCD 64 is constituted of the vertical transfer channel 73, upper insulating film 74 and vertical transfer electrode 75.

A light shielding film 79 of, e.g., tungsten, is formed above the vertical transfer electrode 75, with the insulating silicon oxide film 77 being interposed therebetween. Openings 79a are formed through the light shielding film 79 at positions above the charge accumulation regions 71. A silicon nitride film 78 is formed on the light shielding film 79; The silicon nitride film 78 is not necessarily required.

As described above, the light shielding film 79 has the openings 79a above the charge accumulation regions 71 and prevents light incident upon the pixel area 61 from entering the region other than the photoelectric conversion elements.

A planarized layer 83a made of, e.g., borophosphosilicate glass (BPSG) is formed above the light shielding film 79. On this planarized surface, a color filter layer 84 is formed which is of three primary colors: red (R), green (G) and blue (B). Another planarized layer 83b is formed on the color filter layer 84. On the planarized layer 83b having a planarized surface, micro lenses 85 are formed, for example, by melting and solidifying a photoresist pattern of micro lenses. Each micro lens 85 is a fine hemispherical convex lens disposed above each charge accumulation region 71. The micro lens 85 converges incidence light to the photoelectric conversion element. Light converged by one micro lens 85 passes through the color filter layer 84 of one of the red (R), green (G) and blue (B) and becomes incident upon one photoelectric conversion element. Therefore, the photoelectric conversion elements include three types of photoelectric conversion elements: photoelectric conversion elements upon which light passed through the red (R) color filter layer 84 becomes incident; photoelectric conversion elements upon which light passed through the green (G) color filter layer 84 becomes incident; and photoelectric conversion elements upon which light passed through the blue (B) color filter layer 84 becomes incident.

FIGS. 8A and 8B are schematic diagrams illustrating a manufacture method for a solid state image pickup device.

Referring to FIG. 8A, a semiconductor substrate 81, e.g., an n-type silicon substrate, is prepared and p-type impurities, e.g., boron ions, are implanted to form a p-type well 82.

In a surface layer of the well 82, n-type impurities, e.g., phosphorus or arsenic ions, are implanted to form a vertical transfer channel 73, and p-type impurities, e.g., boron ions, are implanted to form a channel stop region 76. An insulating film 74 is formed on the semiconductor substrate 81, the insulating film being an oxide-nitride-oxide (ONO) film including a thermally oxidized silicon oxide film, a silicon nitride film formed through chemical vapor deposition (CVD) and a silicon oxide film formed by thermally oxidizing the surface of the silicon nitride film. The silicon nitride film in the insulating film 74 has a function of an oxygen intercepting film.

A vertical transfer electrode 75 made of, for example, polysilicon, is formed covering the vertical transfer channel 73. The vertical transfer electrode 75 is made of, for example, first and second charge transfer electrodes. Signal charges generated in the photoelectric conversion elements are transferred in the vertical direction by controlling the potential of the vertical transfer channel 73. The vertical transfer electrode 75 is formed by depositing polysilicon on the insulating film 74, for example, by CVD and patterning it through photolithography and etching.

By using the vertical transfer electrode 75 as a mask or by using a resist pattern formed by coating resist on the surfaces of the vertical transfer electrode 75 and insulating film 74 and exposing and developing the resist, n-type impurities, e.g., phosphorus or arsenic ions, are implanted to form a charge accumulation region 71. A buried layer 71a is formed on the charge accumulation region 71 by implanting p-type impurities, e.g., boron ions. A p-type region defined between the charge accumulation region 71 and vertical transfer channel 73 is a read gate 72. The vertical transfer electrode 75 is thermally oxidized to form a silicon oxide film 77 on the surface thereof. Photoelectric conversion elements (charge accumulation regions 71) may be disposed in the square matrix layout or in the honeycomb layout.

Although not shown in the cross sectional view of FIG. 8A, a horizontal CCD 66 and a V drain area 68 are formed on the semiconductor substrate 81 by the processes partially including the above-described processes. For example, by using the same process as the process of forming the first layer vertical transfer electrode in the pixel area, a first layer vertical transfer electrode is formed in the V drain area, and by using the same process as the process of forming the second layer vertical transfer electrode in the pixel area, a gate control electrode in the V drain area is formed above the first vertical transfer electrode. An amplifier 67 and the like are also formed. The V drain area will be described later more in detail.

Referring to FIG. 8B, a light shielding film 79 of, for example, tungsten, is formed above the silicon oxide film 77. Resist is coated on the light shielding film 79, exposed and developed to leave the resist in predetermined areas. By using this resist as a mask, the light shielding film 79 is etched to form an opening 79a above each charge accumulation region 71.

A silicon nitride film 78 is formed covering the light shielding film 79, and then a planarized layer 83a of BPSG is formed, for example, by CVD. For example, a deposited BPSG film is reflowed at 850° C. to form the planarized layer 83a. In addition to reflow, planarization may be performed, for example, by chemical mechanical polishing (CMP). Instead of BPSG, silicon oxide doped with impurities to lower a melting point may also be used.

On the planarized surface of the planarized layer 83a, a color filter layer 84 of three primary colors of red (R), green (G) and blue (B) is formed. For example, the color film layer 84 is formed by coating photoresist liquid mixed with granular pigment (pigment dispersed resist liquid) on the surface of the planarized layer 83a, exposing and developing it and curing it at a curing temperature of 220° C. Filter layers of three colors of red (R), green (G) and blue (B) are sequentially formed.

A planarized layer 83b is formed on the color filter layer 84 because the surface of the color filter layer 84 is irregular. For example, the planarized layer 83b is formed by coating material having the similar composition as that of transparent resin and curing it at a curing temperature of 220° C. Next, micro lenses 85 are formed on the planarized layer 83b.

FIGS. 9A and 9B are a schematic plan view and a schematic cross sectional view illustrating the V drain area 68.

Referring to FIG. 9A, as described earlier, the V drain area 68 is disposed adjacent to the pixel area 61 on a downstream side of the signal charge vertical transfer direction of the pixel array (between the pixel area 61 and horizontal CCD).

The V drain area 68 has a V drain (vertical CCD drain) 68a having a function of sweeping out, at high speed, charges excessively generated in the photosensors 62, residual charges in the photosensors 62, vertical transfer channels 73 and the like, and unnecessary charges generated in the area other than the pixel area. The V drain 68a has a drain 95 of an n-type impurity doped region disposed, for example, at each column of the photosensors 62. The drain 95 is formed near at the vertical transfer channel 73 extending from the pixel area 61. In the V drain 68a, a gate control electrode 99 is formed covering the first layer vertical transfer electrode 75b.

FIG. 9B is a cross sectional view taken along line 9B-9B shown in FIG. 9A. Unnecessary charges are moved from the vertical transfer channel 73 to the drain 95 via the gate 94. The gate 94 is a barrier region defined between the vertical transfer channel 73 and drain 95. The potential of the gate 94 is controlled by a voltage (sweeping voltage) applied to the gate control electrode 99. Unnecessary charges are drained (swept) into the drain 95. The unnecessary charges swept (moved) into the drain 95 are ejected outside the V drain 68a via a metal wiring 96. The metal wiring 96 is electrically connected to a contact 100 of the drain 95.

In order to simplify the drawing, the structure between the gate control electrode 99 and metal wiring 96 is omitted. The structure includes, similar to the structure shown in FIG. 7D, the silicon oxide film 77 on the gate control electrode 99, upper light shielding film 79 with the openings 79a, upper silicon nitride film 78 and planarized layer 83a.

The voltages applied to constituent elements are approximately as in the following. A power source voltage of about 15 V is applied to the drain 95, metal wiring 96 and gate control voltage 99. A pulse voltage of about 0 V to −10 V is applied to the first layer vertical transfer electrode 75b for signal charge transfer.

A solid state image pickup device having a V drain 68a can perform an operation necessary for high speed signal charge drive, such as consecutive photographing.

An insulating film 74 of the V drain 68a is formed by the same process as the process of forming the insulating film 74 in the pixel area 61. Similar to the pixel area, the insulating film (formed on the surface of the semiconductor substrate 81 and under the first layer transfer electrode 75b) of the V drain 68a adopts the ONO structure of the silicon oxide film (bottom oxide film) 74a, silicon nitride film 74b and silicon oxide film (top oxide film) 74c.

Unnecessary charges, partially hot electrons, accelerated by a high electric field generated by a sweeping voltage are trapped at the interface between the silicon nitride film 74b and silicon oxide film 74a, which may induce a variation (temporal change) in the sweeping voltage. If a solid state image pickup device is used in a long term, there may arise the problem of lowering a sweeping performance, and hence lowering the performance and quality of the solid state image pickup device.

FIGS. 10A to 10C are schematic cross sectional views illustrating a manufacture method for the V drain 68a.

Referring to FIG. 10A, ion implantation same as the ion implantation into the pixel area 61 described with reference to FIG. 8A, is performed to form a p-type well 82 and an n-type vertical transfer channel 73. A drain 95 of an n-type impurity region is formed by implanting, for example, phosphorus or arsenic ions. A p-type region between the vertical transfer channel 73 and drain 95 is a gate 94. By using the same process as the process of forming the insulating film 74 in the pixel area 61, an ONO film is formed covering the vertical transfer channel 73, gate 94 and drain 95. The ONO film is constituted of a silicon oxide film (bottom oxide film) 74a, a silicon nitride film 74b and a silicon oxide film (top oxide film) 74c.

A polysilicon film heavily doped with phosphorus is deposited on the ONO film and patterned by anisotropic reactive ion etching using a resist pattern formed by photolithography to thereby form a firs layer vertical transfer electrode 75b.

Referring to FIG. 10B, after the resist pattern is removed, an insulating film 80 is formed by thermally oxidizing the surface of the first layer vertical transfer electrode 75b. The insulating film 80 electrically insulates the first layer vertical transfer electrode 75b from a gate control electrode to be formed next.

Referring to FIG. 10C, a polysilicon film heavily doped with phosphorus is deposited and patterned by anisotropic reactive ion etching and photolithography to thereby form a gate control electrode 99 above the first vertical transfer electrode 75b. The first layer vertical transfer electrode 75b and the insulating film 80 on the electrode 75b in the V drain are formed by the same process as the process of forming those in the pixel area 61, and the gate control electrode 99 is formed by the same process as the process of forming the second layer vertical transfer electrode 75c in the pixel area 61. The gate control electrode 99 in the V drain 68a is formed covering the gate 94.

Although not shown, as described earlier, a silicon oxide film 77 is formed on the gate control electrode 99. A light shielding film of tungsten is formed on the silicon oxide film, and openings are formed through the light shielding film by using a resist pattern. A silicon nitride film and a planarized layer are formed on the light shielding film.

For example, by using a resist pattern, a contact hole is formed by reactive ion etching, extending from the surface of the planarized layer to the drain 95. A contact 100 of a high concentration n-type impurity region is formed in the drain 95 by implanting n-type impurities, e.g., arsenic ions, via the contact hole. A metal wiring 96 is formed being electrically connected to the contact 100 in the drain 95 via the contact hole.

An invention aiming to provide a solid state image pickup device is disclosed which device is stable, highly reliable, thin, and high in breakdown voltage and can suppress a temporal change in the read voltage to be caused by hot electrons (e.g., refer to Japanese Patent Laid-open Publication No. 2003-332556).

The solid state image pickup device according to the invention described in Japanese Patent Laid-open Publication No. 2003-332556, includes photoelectric conversion elements formed in a semiconductor substrate and an insulating film above a vertical transfer channel near the photoelectric conversion elements. The insulating film has a lamination structure of silicon oxide films and a silicon nitride film. At least the silicon nitride film of the insulating film does not extend near to the upper end portion of the photoelectric conversion element.

DISCLOSURE OF THE INVENTION

An object of this invention is to provide a high quality solid state image pickup device and its manufacture method.

According to one aspect of the present invention, there is provided a solid state image pickup device comprising: a plurality of charge accumulation regions of a first conductivity type, disposed in a semiconductor substrate in a matrix shape, for photoelectrically converting incidence light into signal charges and accumulating the signal charges; a plurality of vertical transfer channels of the first conductivity type each disposed in the semiconductor substrate adjacent to each column of the charge accumulation regions, the vertical transfer channel transferring the signal charges accumulated in the charge accumulation regions along generally a column direction; a vertical transfer electrode formed above the vertical transfer channels for transferring the signal charges accumulated in the charge accumulation regions by controlling a potential of each of the vertical transfer channels; a drain of the first conductivity type for sweeping signal charges, the drain being disposed near each of the vertical transfer channels on a downstream side of the column direction of an area of the charge accumulation regions disposed in the matrix shape; a gate as a barrier region formed between the drain and a corresponding one of the vertical transfer channels; an insulating film formed on the drain, the gate and the vertical transfer channel, the insulating film including silicon oxide films and a silicon nitride film, the silicon nitride film covering the vertical transfer channel and extending above the gate excepting a portion near the drain; a gate control electrode formed on the insulating film for sweeping the signal charges transferred by the vertical transfer channel to the drain; and a horizontal CCD formed on the downstream side of the column direction of an area of the drains, the horizontal CCD transferring the signal charges transferred from the vertical transfer channels along a row direction.

According to another aspect of the present invention, there is provided a manufacture method for a solid state image pickup device, comprising steps of: (a) implanting impurities into a semiconductor substrate to form a plurality of vertical transfer channels of a first conductivity type for transferring electric charges in generally a first direction and to form a drain of the first conductivity type near each of the vertical transfer channels via a gate which forms a barrier; (b) depositing a first silicon oxide film, a silicon nitride film and a second silicon oxide film in an order from a bottom, on surfaces of the vertical transfer channels, the gates and the drains; (c) forming a first layer vertical transfer electrode on the second silicon oxide film above the vertical transfer channel; (d) forming an insulating film on a surface of the first layer vertical transfer electrode; (e) etching the second silicon oxide film and the silicon nitride film in such a manner that the silicon nitride film covers the vertical transfer channel and extends above the gate excepting a portion near the drain; (f) forming a gate control electrode on the insulating film and on the first silicon oxide film exposed at the step (e); and (g) forming a plurality of charge accumulation regions in a matrix shape in an area defined on an upstream side of the first direction further than the drains, in such a manner that each column of the charge accumulation regions is formed near each of the vertical transfer channels.

According to another aspect of the present invention, there is provided a manufacture method for a solid state image pickup device, comprising steps of: (a) implanting impurities into a semiconductor substrate to form a plurality of vertical transfer channels of a first conductivity type for transferring electric charges in generally a first direction and to form a drain of the first conductivity type near each of the vertical transfer channels via a gate which forms a barrier; (b) depositing a first silicon oxide film, a silicon nitride film and a second silicon oxide film in an order from a bottom, on surfaces of the vertical transfer channels, the gates and the drains; (c) anisotropically etching the second silicon oxide film and the silicon nitride film to leave the second silicon oxide film and the silicon nitride film silicon nitride film in first and second areas, in the first area, the second silicon oxide film and the silicon nitride film covering the vertical transfer channel and extending above the gate excepting a portion near the drain, and in the second area, the second silicon oxide film and the silicon nitride film covering the drain excepting a peripheral portion of the drain; (d) forming a first layer vertical transfer electrode on the second silicon oxide film in the first area, (e) forming an insulating film on a surface of the first layer vertical transfer electrode; (f) forming a gate control electrode on the insulating film and on the first silicon oxide film between the first and second areas exposed at the step (c); and (g) forming a plurality of charge accumulation regions in a matrix shape in an area defined on an upstream side of the first direction further than the drains, in such a manner that each column of the charge accumulation regions is formed near each of the vertical transfer channels.

According to another aspect of the present invention, there is provided a manufacture method for a solid state image pickup device, comprising steps of: (a) implanting impurities into a semiconductor substrate to form a plurality of vertical transfer channels of a first conductivity type for transferring electric charges in generally a first direction and to form a drain of the first conductivity type near each of the vertical transfer channels via a gate which forms a barrier; (b) depositing a first silicon oxide film, a silicon nitride film and a second silicon oxide film in an order from a bottom, on surfaces of the vertical transfer channels, the gates and the drains; (c) forming a first layer vertical transfer electrode on the second silicon oxide film in the first area; (d) anisotropically etching the second silicon oxide film and the silicon nitride film to leave the second silicon oxide film and the silicon nitride film silicon nitride film in first and second areas, in the first area, the second silicon oxide film and the silicon nitride film covering the vertical transfer channel and extending above the gate excepting a portion near the drain, and in the second area, the second silicon oxide film and the silicon nitride film covering the drain excepting a peripheral portion of the drain; (e) forming an insulating film on a surface of the first layer vertical transfer electrode; (f) forming a gate control electrode on the insulating film and on the first silicon oxide film between the first and second areas; and (g) forming a plurality of charge accumulation regions in a matrix shape in an area defined on an upstream side of the first direction further than the drains, in such a manner that each column of the charge accumulation regions is formed near each of the vertical transfer channels.

According to another aspect of the present invention, there is provided a manufacture method for a solid state image pickup device, comprising steps of: (a) implanting impurities into a semiconductor substrate to form a plurality of vertical transfer channels of a first conductivity type for transferring electric charges in generally a first direction and to form a drain of the first conductivity type near each of the vertical transfer channels via a gate which forms a barrier; (b) depositing a first silicon oxide film, a silicon nitride film and a second silicon oxide film in an order from a bottom, on surfaces of the vertical transfer channels, the gates and the drains; (c) forming a first layer vertical transfer electrode on the second silicon oxide film in the first area; (d) forming an insulating film on a surface of the first layer vertical transfer electrode; (e) anisotropically etching the second silicon oxide film and the silicon nitride film to leave the second silicon oxide film and the silicon nitride film silicon nitride film in first and second areas, in the first area, the second silicon oxide film and the silicon nitride film covering the vertical transfer channel and extending above the gate excepting a portion near the drain, and in the second area, the second silicon oxide film and the silicon nitride film covering the drain excepting a peripheral portion of the drain; (f) forming a gate control electrode on the insulating film and on the first silicon oxide film between the first and second areas; and (g) forming a plurality of charge accumulation regions in a matrix shape in an area defined on an upstream side of the first direction further than the drains, in such a manner that each column of the charge accumulation regions is formed near each of the vertical transfer channels.

According to these solid state image pickup device manufacture methods, a high quality solid state image pickup device can be manufactured which suppresses a temporal change in a charge sweeping voltage and deterioration of characteristics to be caused by a long term use.

According to the present invention, it is possible to provide a high quality solid state image pickup device and its manufacture method.

BEST MODE FOR CARRYING OUT THE INVENTION

FIGS. 1A to 1D are schematic cross sectional views illustrating a manufacture method for a characteristic portion (V drain) of a solid state image pickup device according to the first embodiment of the present invention.

Figure 1A:
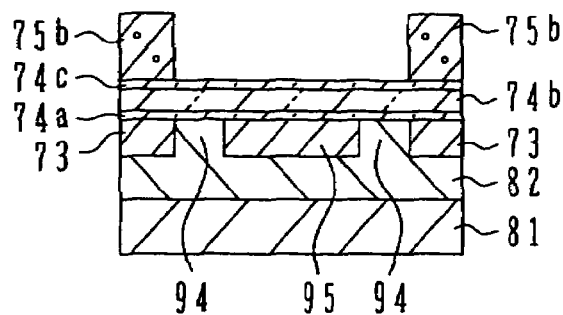
FIGS. 1A to 1D are schematic cross sectional views illustrating a manufacture method for a characteristic portion (V drain) of a solid state image pickup device according to a first embodiment of the present invention.
Figure 10A:
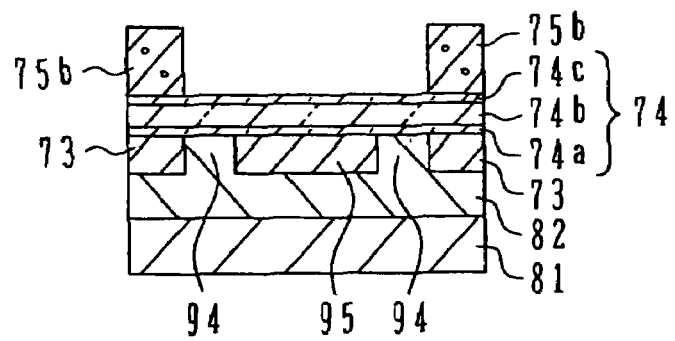
FIGS. 10A to 10C are schematic cross sectional views illustrating a manufacture method for a V drain.

FIG. 1A is similar to FIG. 10A. Formed on a semiconductor substrate 81 by similar processes to those described with reference to FIG. 10A are a well 82, a vertical transfer channel 73, a drain 95, a silicon oxide film (bottom oxide film) 74a, a silicon nitride film 74b, a silicon oxide film (top oxide film) 74c and a first layer vertical transfer electrode 75b on the silicon oxide film (top oxide film) 74c above the vertical transfer channel 73. A gate 94 of a p-type region is defined between the vertical transfer channel 73 and drain 95.

The vertical transfer channel 73 and drain 95 are formed by implanting impurity ions, e.g., phosphorus or arsenic ions, at a dose of $5\times10^{12}$ cm$^{-2}$ and an acceleration energy of 100 keV.

For example, the silicon oxide film (bottom oxide film) 74a has a thickness of 25 nm, the silicon nitride film 74b has a thickness of 50 nm and the silicon oxide film (top oxide film) 74c has a thickness of 5 nm.

In order to form the first layer vertical transfer electrode 75b, a polysilicon film heavily doped with phosphorus is deposited to a thickness of 0.3 µm.

Figure 1B:
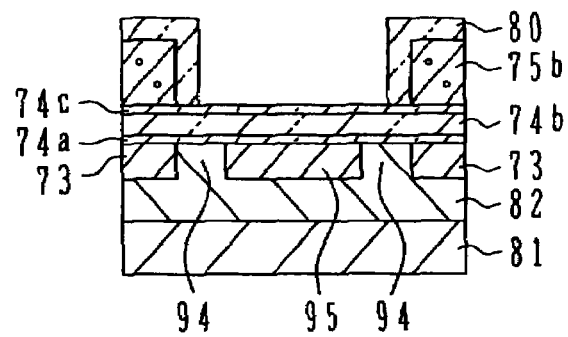
Figure 10B:
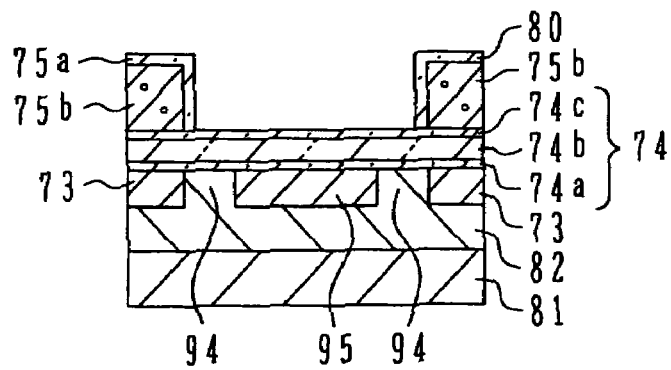

FIG. 1B is similar to FIG. 10B. By using similar processes to those described with reference to FIG. 10B, an insulating film 80 having a thickness of 100 nm is formed on the first layer vertical transfer electrode 75b.

Figure 1C:
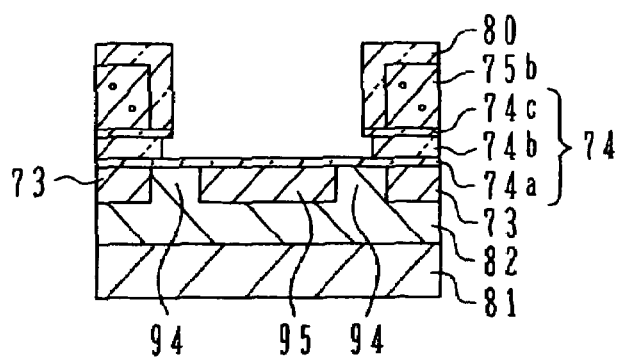

As shown in FIG. 1C, by using as a mask the first layer vertical transfer electrode 75b formed with the insulating film 80, the silicon oxide film (top oxide film) 74c is removed by using hydrofluoric acid chemical. The silicon oxide film may be removed by chemical dry etching (CDE) which damages less the underlying silicon nitride film 74b.

Thereafter, by using the first layer vertical transfer electrode 75b as a mask, the silicon nitride film 74b is etched by isotropic etching, e.g., isotropic chemical dry etching, or wet etching using hot phosphoric acid. In this case, the silicon nitride film 74b is etched in such a manner that the silicon nitride film 74b covers the vertical transfer channel 73 and extends above the gate 94 excepting the region near the drain 95. Since isotropic etching is performed, the side walls of the silicon nitride film 74b are retracted from the surface of the insulating film 80 on the side walls of the first layer vertical transfer electrode 75b toward.

Figure 1D:
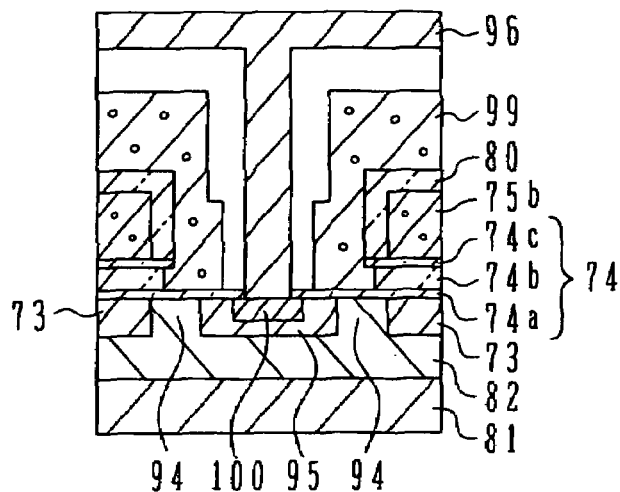
Figure 10C:
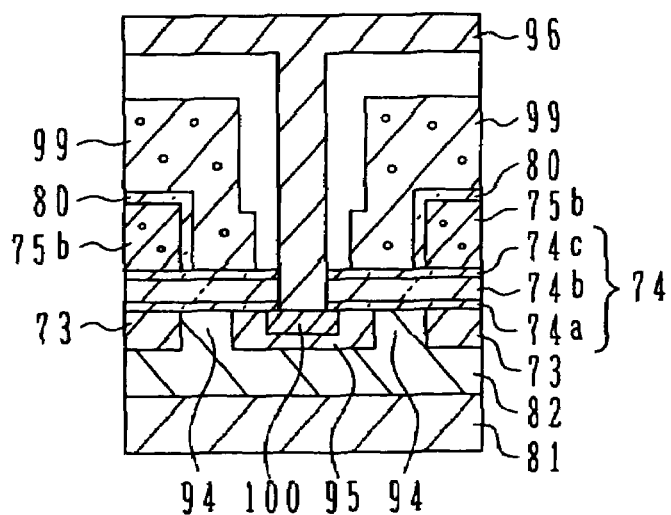

FIG. 1D is similar to FIG. 10C. By using the process similar to the process described with reference to FIG. 10C, a gate control electrode 99 and a metal wiring 96 are formed. The gate control electrode 99 is formed covering the insulating film 80 and the surface of the silicon oxide film 74a exposed by etching the silicon nitride film 74b.

In order to form a contact 100 in the drain 95, for example, arsenic ions are implanted at a dose of $1\times10^{15}$ cm$^{-2}$ and an acceleration energy of 100 keV.

The gate control electrode 99 is formed by depositing a polysilicon film heavily doped with phosphorus to a thickness of 0.3 µm.

The contact 100 may be formed after the drain 95 is formed by the process described with reference to FIG. 1A, for example, by implanting arsenic ions at a dose of $1\times10^{15}$ cm$^{-2}$ and an acceleration energy of 100 keV by using a resist pattern.

Figure 8A:
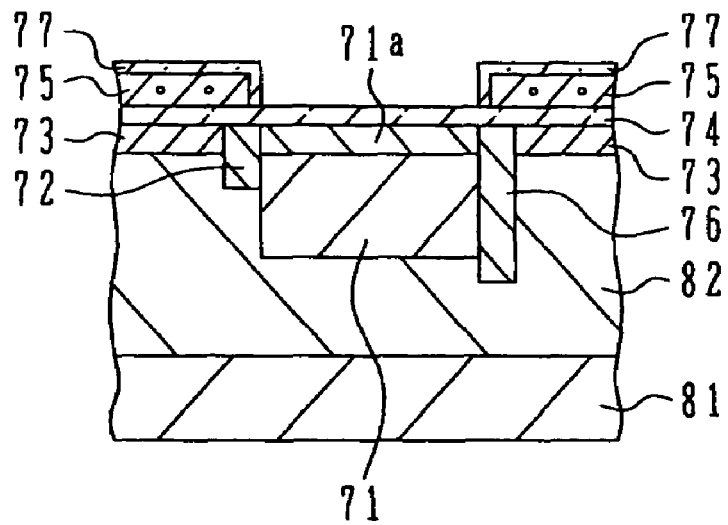
FIGS. 8A and 8B are schematic cross sectional views illustrating a manufacture method for a solid state image pickup device.
Figure 8B:
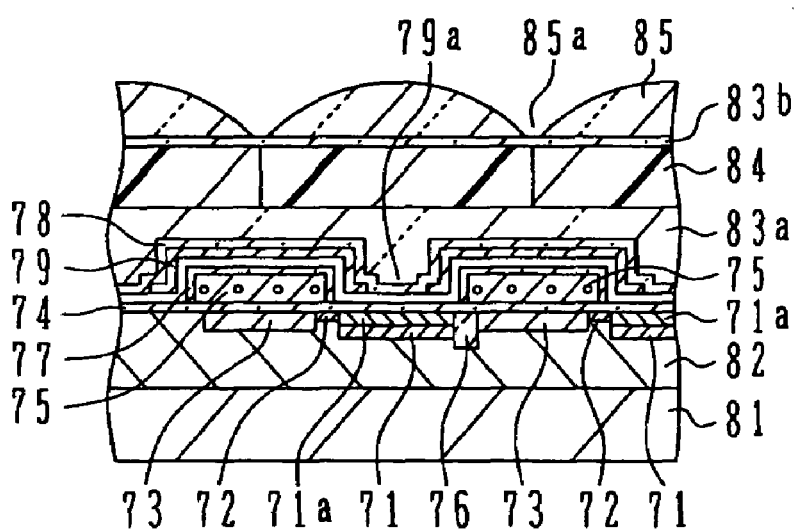
Figure 9A:
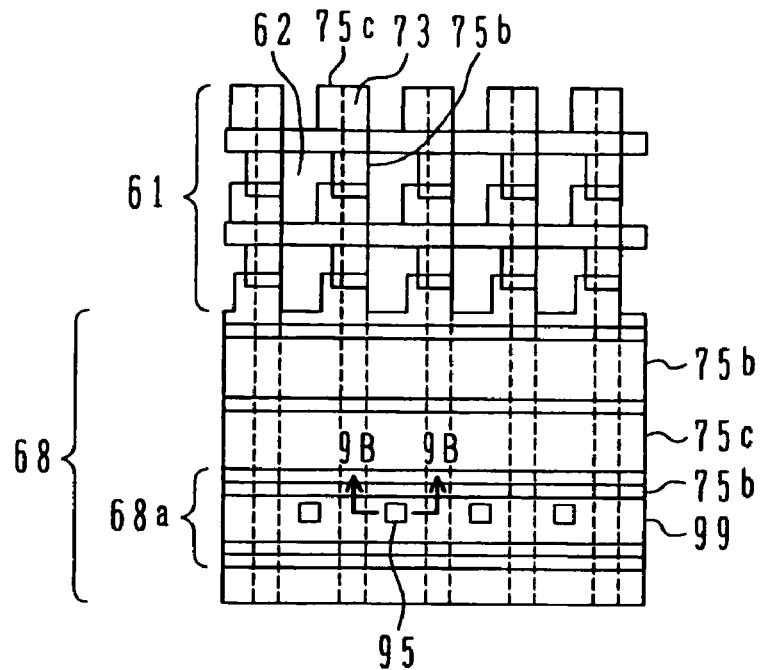
FIGS. 9A and 9B are a schematic plan view and a schematic cross sectional view illustrating a V drain area.
Figure 9B:
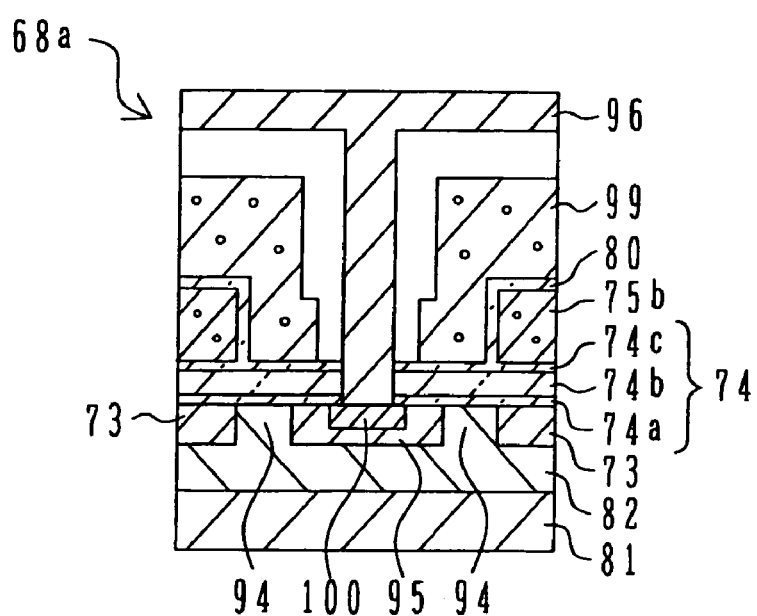

The V drain 68a of the solid state image pickup device is manufactured in this manner. Other regions of the solid state image pickup device can be manufactured, for example, by similar processes to those described with reference to FIGS. 8A and 8B.

In the V drain of the solid state image pickup device manufactured by the above-described processes, the insulating film formed on the drain, gate and vertical transfer channel includes the silicon oxide films and silicon nitride film. The silicon nitride film of the insulating film covers the vertical transfer channel and extends above the gate excepting the region near the drain.

Since the silicon nitride film does not exist near the drain, it is possible to reduce hot electrons to be trapped at the interface between the silicon nitride film and silicon oxide film (bottom oxide film). A temporal change in the charge sweeping voltage and deterioration of the characteristics to be caused by a long term use can be suppressed and a high quality solid state image pickup device can be manufactured.

Figure 2A:
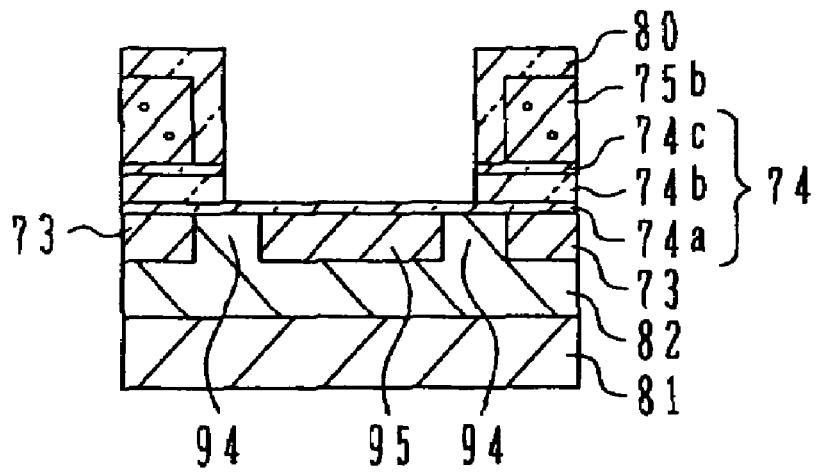
FIGS. 2A and 2B are schematic cross sectional views illustrating a manufacture method for a characteristic portion (V drain) of a solid state image pickup device according to a second embodiment of the present invention.
Figure 2B:
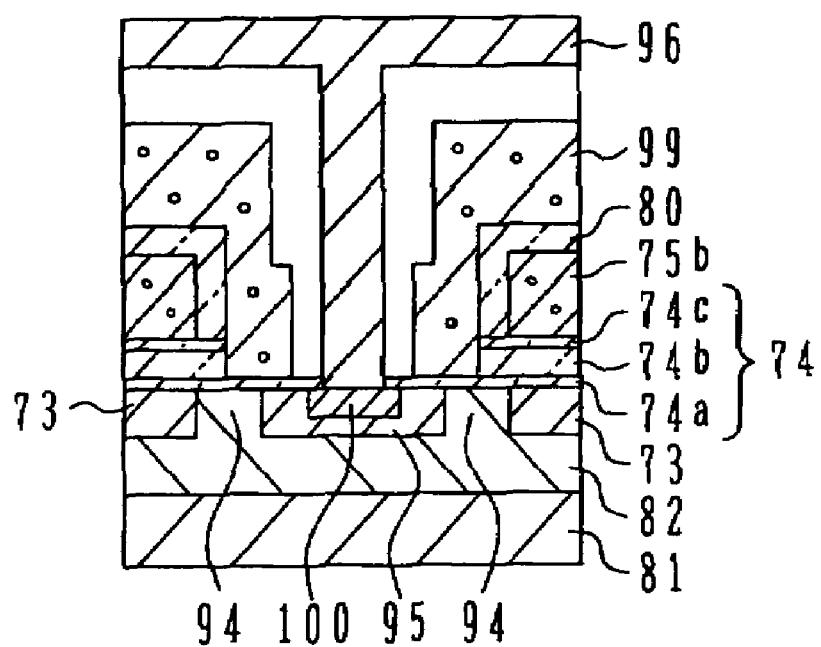

FIGS. 2A and 2B are schematic cross sectional views illustrating a manufacture method for a characteristic portion (V drain) of a solid state image pickup device according to the second embodiment of the present invention.

The manufacture method of the second embodiment is different from that of the first embodiment in an etching process for the silicon nitride film 74b.

FIG. 2A corresponds to FIG. 1C.

In the manufacture method of the first embodiment, by using as a mask the first layer vertical transfer electrode 75b with the insulating film 80, the silicon oxide film (top oxide film) 74c was removed by using hydrofluoric acid chemical and thereafter the silicon nitride film 74b was etched by isotropic etching. Since the silicon nitride film 74b was etched by isotropic etching, the side walls of the silicon nitride film 74b are retracted from the surface of the insulating film 80 on the side walls of the first layer vertical transfer electrode 75b.

In the manufacture method of the second embodiment, by using as a mask the first layer vertical transfer electrode 75b with the insulating film 80, the silicon oxide film 74c is removed and thereafter the silicon nitride film 74b is etched by anisotropic etching, e.g., anisotropic reactive ion etching (RIE). Since anisotropic etching is used, the side walls of the silicon nitride film 74b are generally flush with the surface of the insulating film 80 on the side walls of the first layer vertical transfer electrode 75b.

FIG. 2B corresponds to FIG. 1D. Similar to the manufacture method of the first embodiment, a gate control electrode 99 and a metal wiring 95 are formed. Since the silicon nitride film 74b is etched by anisotropic etching, side etch will not occur so that the breakdown voltage between the first layer vertical transfer electrode 75b and gate control electrode 99 can be prevented from being lowered.

FIGS. 3A to 3D are schematic cross sectional views illustrating a manufacture method for a characteristic portion (V drain) of a solid state image pickup device according to the third embodiment of the present invention.

In the first and second embodiments, after the first layer vertical transfer electrode 75b and insulating film 80 were formed, the silicon nitride film 74b was etched. The third embodiment is different from the first and second embodiment in that after the silicon nitride film 74b is etched, the first layer vertical transfer electrode 75b is formed, and in a position where the silicon nitride film 74b is left after etching and other points.

The third embodiment is different from fourth and fifth embodiments to be described later in at which stage the silicon nitride film 74b is etched and in other associated points.

Figure 3A:
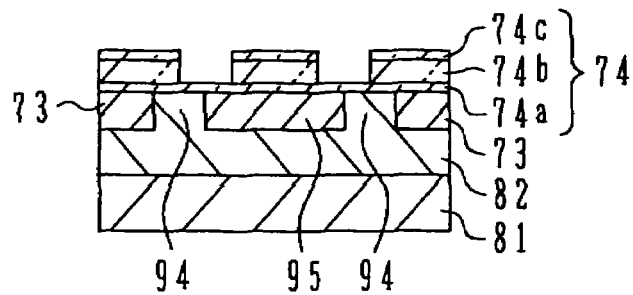
FIGS. 3A to 3D are schematic cross sectional views illustrating a manufacture method for a characteristic portion (V drain) of a solid state image pickup device according to a third embodiment of the present invention.

As shown in FIG. 3A, similar to the process described with reference to FIG. 1A, a semiconductor substrate 81 is formed with a well 82, a vertical transfer channel 73, a drain 95, a silicon oxide film (bottom oxide film), a silicon nitride film and a silicon oxide film (top oxide film).

Next, a resist pattern is formed on the silicon oxide film (top oxide film). By using this resist pattern as a mask, the silicon oxide film (top oxide film) is etched by using hydrofluoric acid chemical. Next, the silicon nitride film is etched by anisotropic reactive ion etching (RIE).

With these etching processes, the silicon oxide film (top oxide film) 74c and silicon nitride film 74b cover the vertical transfer channel 73 and extend above the gate 94 excepting a portion near the drain 95, and are left above the drain 95 excepting the peripheral portions near the gates 94. In this manner, an insulating film 74 is formed constituted of the silicon oxide film (bottom oxide film) 74a, silicon nitride film 74b and silicon oxide film (top oxide film) 74c.

Figure 3B:
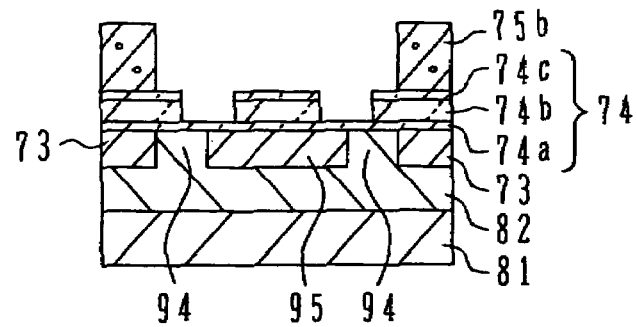

As shown in FIG. 3B, similar to the first and second embodiments, a first layer vertical transfer electrode 75b is formed on the silicon oxide film (top oxide film) 74c on the silicon nitride film 74b which covers the vertical transfer channel 73 and extends above the gate 94 excepting the portion near the drain 95.

Figure 3C:
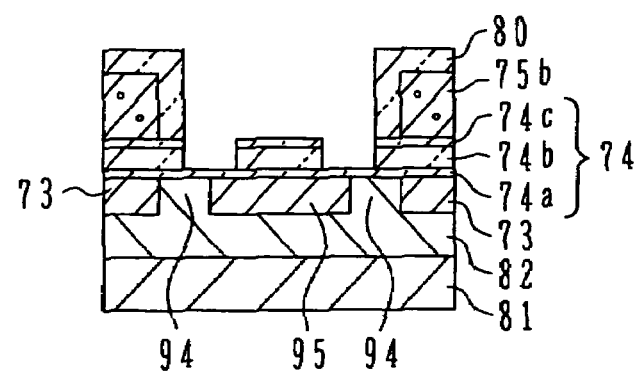

As shown in FIG. 3C, the surface of the first layer vertical transfer electrode 75b is thermally oxidized to form an insulating film 80.

Figure 3D:
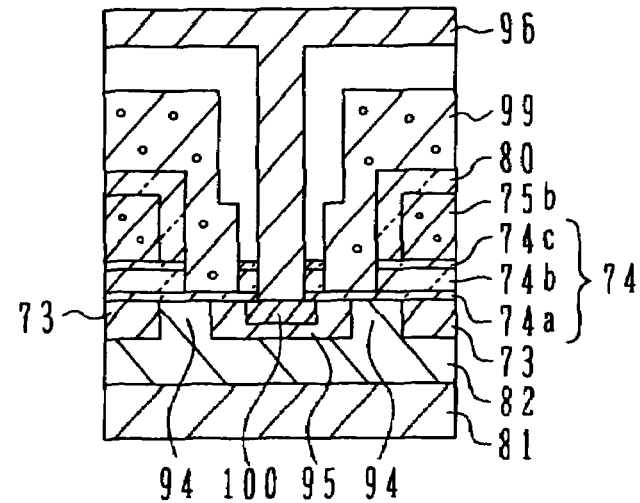

As shown in FIG. 3D, similar to the first and second embodiments, a gate control electrode 99 is formed on the surface of the insulating film 80 and on the surface of the silicon oxide film (bottom oxide film) 74a in an area between the insulating films 74 with the silicon nitride films 74b (between the portions above the vertical transfer channel 73 and drain 95). After an interlayer insulating film is formed, a metal wiring 96 is formed.

Figure 4A:
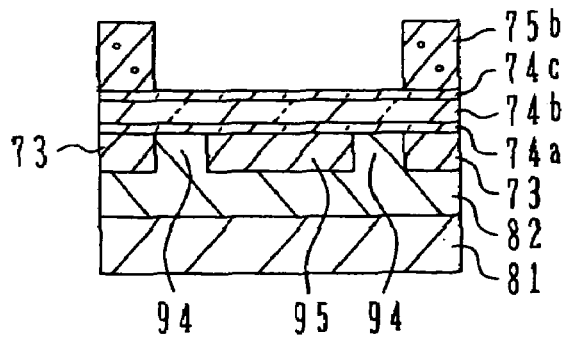
FIGS. 4A to 4C are schematic cross sectional views illustrating a manufacture method for a characteristic portion (V drain) of a solid state image pickup device according to a fourth embodiment of the present invention.
Figure 4B:
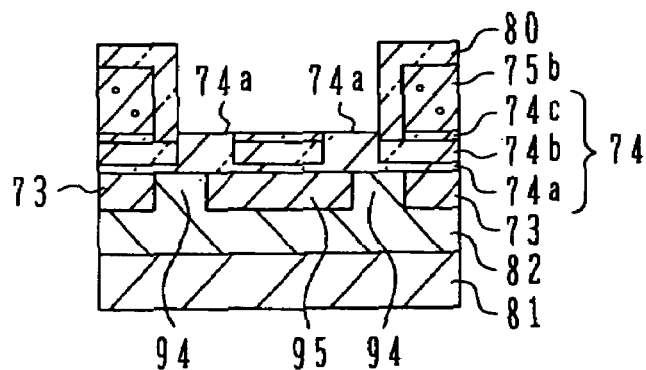
Figure 4C:
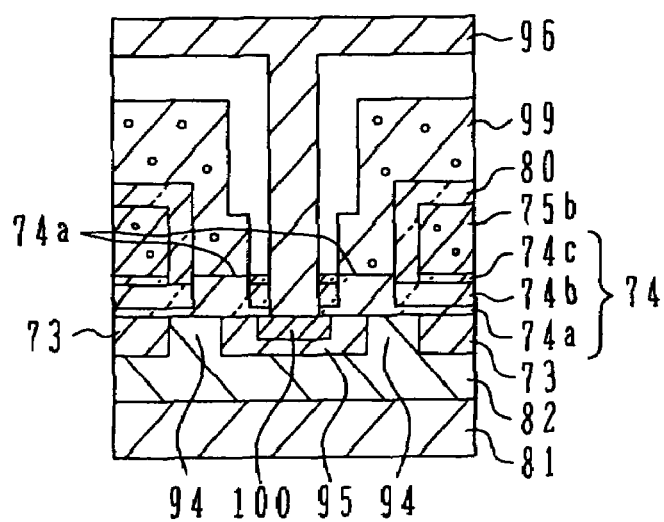

FIGS. 4A to 4C are schematic cross sectional views illustrating a manufacture method for a characteristic portion (V drain) of a solid state image pickup device according to the fourth embodiment of the present invention.

The manufacture method of the fourth embodiment is different from that of the third embodiment in that after a first layer vertical transfer electrode is formed, a silicon nitride film is etched.

FIG. 4A corresponds to FIG. 1A. By similar processes to those described with reference to FIG. 1A, a semiconductor substrate 81 is formed with a well 82, a vertical transfer channel 73, a drain 95, a silicon oxide film (bottom oxide film) 74a, a silicon nitride film 74b, a silicon oxide film (top oxide film) 74c and a first layer vertical transfer electrode 75b.

As shown in FIG. 4B, by using the first layer vertical transfer electrode 75b and a resist pattern as a mask, the silicon oxide film (top oxide film) 74c is selectively etched by using hydrofluoric acid chemical. Next, a resist pattern is formed on the exposed silicon nitride film 74b. By using the resist pattern as a mask, the silicon nitride film 74b is etched by anisotropic reactive ion etching (RIE).

With this etching, the silicon nitride film 74b is left in the area similar to that of the third embodiment described with reference to FIGS. 3A to 3D.

The surface of the first layer vertical transfer electrode 75b is thermally oxidized to form an insulating film 80.

While the first layer vertical transfer electrode 75b is thermally oxidized (to form the insulating film 80), the silicon oxide film (bottom oxide film) 74a is also oxidized in the area between insulating films 74 with the silicon nitride films 74b (between the portions above the vertical transfer channel 73 and drain 95), so that the silicon oxide film (bottom oxide film) 74a becomes thick. In this manner, an insulating film 74 is formed constituted of the silicon oxide film (bottom oxide film) 74a, silicon nitride film 74b and silicon oxide film (top oxide film) 74c.

As shown in FIG. 4C, similar to the first to third embodiments, a gate control electrode 99 is formed on the surface of the insulating film 80 and on the surface of the thick silicon oxide film (bottom oxide film) 74a in an area between the insulating films 74 with the silicon nitride films 74b (between the portions above the vertical transfer channel 73 and drain 95). After an interlayer insulating film is formed, a metal wiring 96 is formed.

FIGS. 5A to 5D are schematic cross sectional views illustrating a manufacture method for a characteristic portion (V drain) of a solid state image pickup device according to the fifth embodiment of the present invention.

The manufacture method of the fifth embodiment is different from that of the third or fourth embodiment in that after a first layer vertical transfer electrode and an insulating film thereon are formed, a silicon nitride film is etched.

Figure 5A:
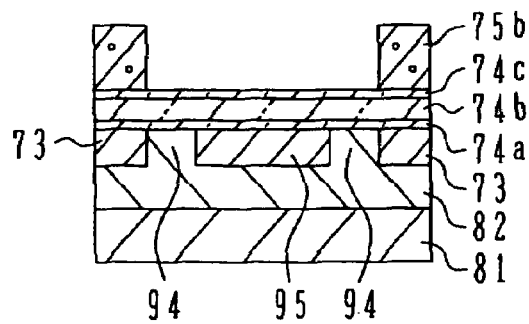
FIGS. 5A to 5D are schematic cross sectional views illustrating a manufacture method for a characteristic portion (V drain) of a solid state image pickup device according to a fifth embodiment of the present invention.

FIG. 5A corresponds to FIG. 1A. By similar processes to those described with reference to FIG. 1A, a semiconductor substrate 81 is formed with a well 82, a vertical transfer channel 73, a drain 95, a silicon oxide film (bottom oxide film) 74a, a silicon nitride film 74b, a silicon oxide film (top oxide film) 74c and a first layer vertical transfer electrode 75b.

Figure 5B:
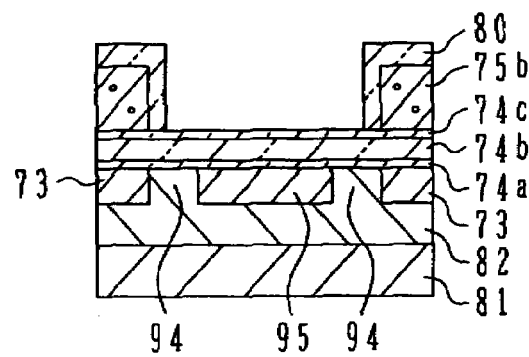

As shown in FIG. 5B, the surface of the first layer vertical transfer electrode 75b is thermally oxidized to form an insulating film 80.

Figure 5C:
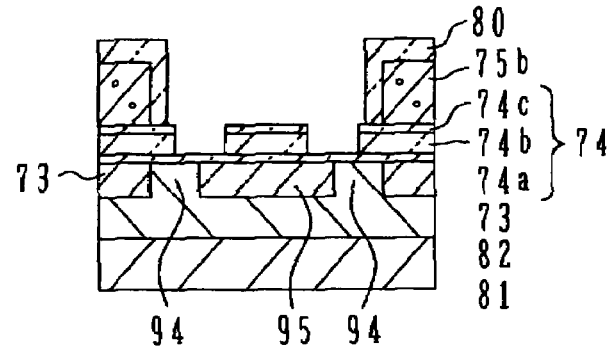

As shown in FIG. 5C, a resist pattern is formed on the silicon oxide film (top oxide film) 74c. By using the resist pattern as a mask, the silicon oxide film (top oxide film) 74c is selectively etched by using hydrofluoric acid chemical. Next, the silicon nitride film 74b is etched by anisotropic reactive ion etching (RIE). In this manner, an insulating film 74 is formed constituted of the silicon oxide film (bottom oxide film) 74a, silicon nitride film 74b and silicon oxide film (top oxide film) 74c.

With this etching, the silicon oxide film (top oxide film) 74c and silicon nitride 74b are left in the areas similar to those of the third embodiment.

Figure 5D:
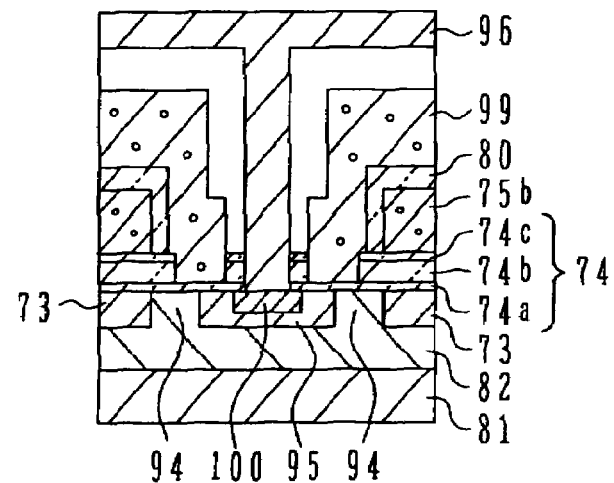

As shown in FIG. 5D, similar to the first to fourth embodiments, a gate control electrode 99 is formed on the surface of the insulating film 80 and on the surface of the silicon oxide film (bottom oxide film) 74a in an area between the insulating films 74 with the silicon nitride films 74b (between the portions above the vertical transfer channel 73 and drain 95). After an interlayer insulating film is formed, a metal wiring 96 is formed.

By using the manufacture methods of the second to fifth embodiments, the V drain 68a of the solid state image pickup device is manufactured. Other portions of the solid state image pickup device can be manufactured by processes similar to those described with reference to FIGS. 8A and 8B, as described in the first embodiment.

In the V drain of the solid state image pickup device manufactured by the processes of the second to fifth embodiments, the insulating film formed on the drain, gate and vertical transfer channel is also constituted of the silicon oxide films and silicon nitride film. The silicon nitride film of the insulating film covers the vertical transfer channel and extends above the gate excepting the region near the drain.

Since the silicon nitride film does not exist near the drain, it is possible to reduce hot electrons to be trapped at the interface between the silicon nitride film and silicon oxide film (bottom oxide film). A temporal change in the charge sweeping voltage and deterioration of the characteristics to be caused by a long term use can be suppressed and a high quality solid state image pickup device can be manufactured.

Figure 6A:
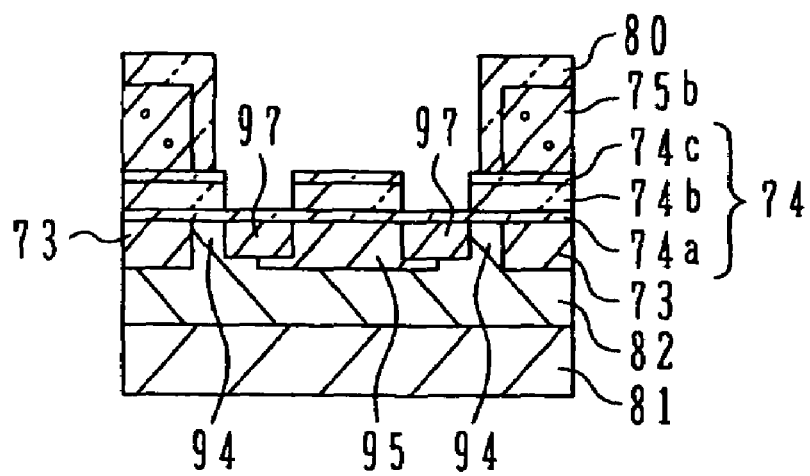
FIGS. 6A and 6B are schematic cross sectional views illustrating a process capable of being added to the manufacture methods of the first to fifth embodiments.
Figure 6B:
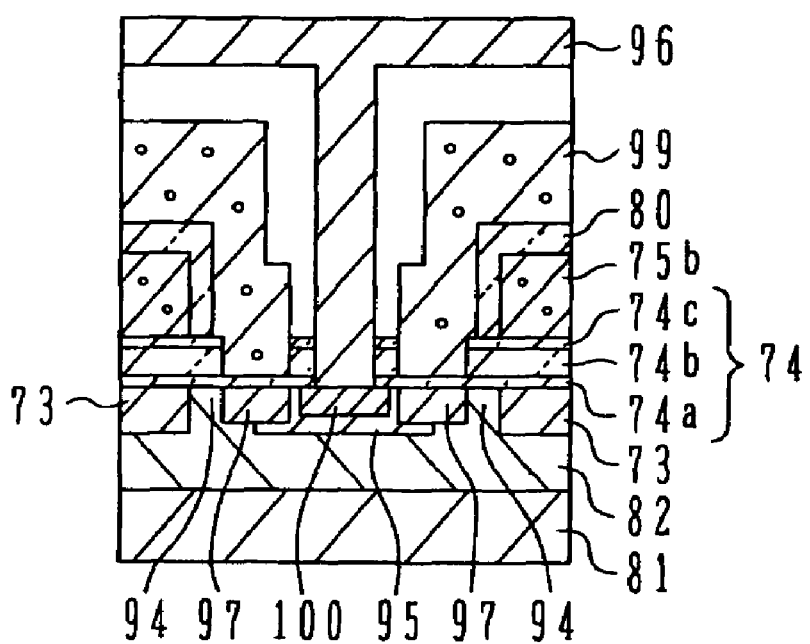
Figure 7A:
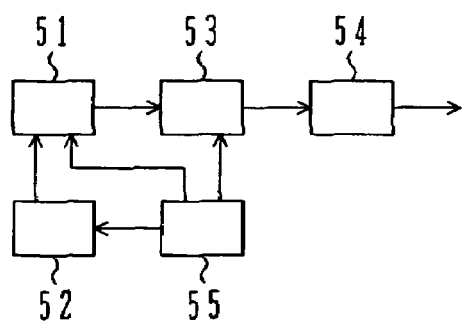
FIG. 7A is a block diagram showing a main portion of a solid state image pickup apparatus assembling a solid state image pickup device.
Figure 7C:
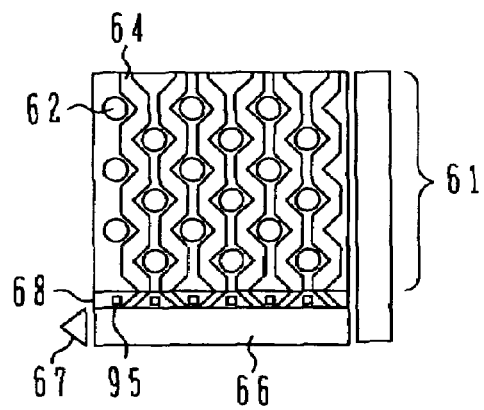
FIGS. 7B and 7C are schematic plan views showing the structure of the solid state image pickup device.
Figure 7B:
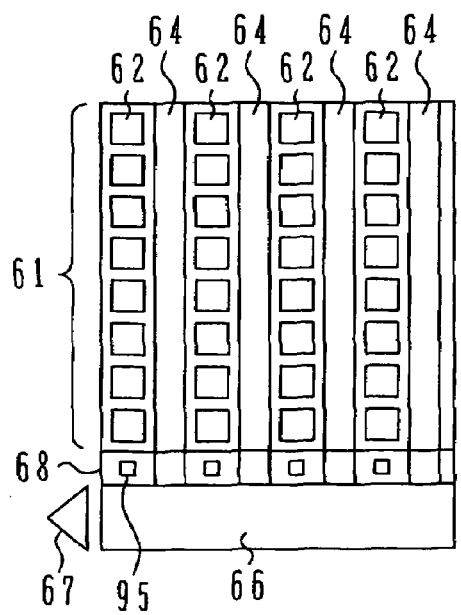
Figure 7D:
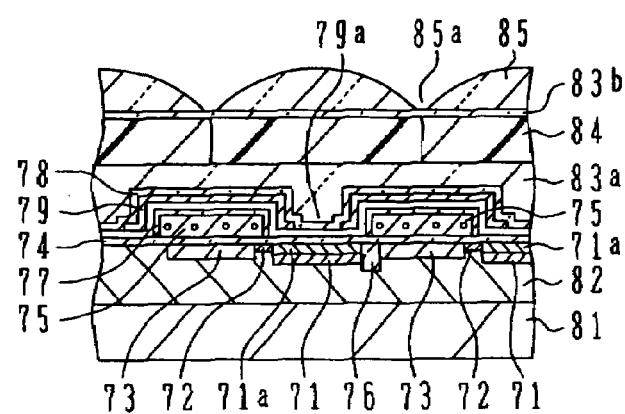
FIG. 7D is a schematic cross sectional view showing a portion of a pixel area of a solid state image pickup device.

FIGS. 6A and 6B are schematic cross sectional views illustrating a process capable of being added to the manufacture methods of the first to fifth embodiments. This process dopes impurities (n-type impurities) having a conductivity type opposite to that of the gate 94, into at least a portion of the gate 94. With reference to FIGS. 6A and 6B, description will be made on this process added to the fifth embodiment.

With reference to FIG. 6A, description will be made on the processes following the process of etching the silicon nitride film 74b described with reference to FIG. 5C.

After the silicon nitride film 74b is etched, n-type impurity ions are implanted to form an n-type impurity doped region 97 in at least a portion of the gate 94.

This ion implantation is performed by implanting boron or arsenic n-type impurity ions at a dose smaller than that for the horizontal transfer channel, e.g., at a dose of $3 \times 10^{12}$ cm$^{-2}$ and an acceleration energy of 100 keV.

As shown in FIG. 6B, similar to the processes described with reference to FIG. 5D, a gate control electrode 99 and a metal wiring 96 are formed.

Since the n-type impurity doped region 97 is formed in at least a portion of the gate 94 of the V drain 68a, the transistor structure of the gate 94 has a shorter channel than that without the n-type impurity doped region. The effects of sweeping charges to the drain 95 can therefore be enhanced.

This ion implantation for the n-type impurity doped region 97 is also applied to the manufacture methods of the first to fourth embodiments, after the silicon nitride film is etched as described with reference to FIGS. 1C, 2A, 3A and 4A, to present similar effects. Instead of forming n-type impurity doped region 97 immediately after etching, the n-type impurity doped region 97 may be performed after the silicon nitride film is etched and before the gate control electrode is formed.

The present invention has been described in connection with the preferred embodiments. The invention is not limited only to the above embodiments. For example; the conductivity types, n-type and p-type, may be reversed. Instead of forming a p-well in an n-type semiconductor substrate, a p-type semiconductor substrate may be used. It will be apparent to those skilled in the art that other various modifications, improvements, combinations, and the like can be made.

INDUSTRIAL APPLICABILITY

The above-described solid state image pickup device can be used with general digital cameras and apparatuses equipped with a digital camera function such as a portable phone.

What I claim is:

1. A solid state image pickup device comprising:
   a plurality of charge accumulation regions of a first conductivity type, disposed in a semiconductor substrate in a matrix shape, for photoelectrically converting incidence light into signal charges and accumulating the signal charges;
   a plurality of vertical transfer channels of the first conductivity type each disposed in said semiconductor substrate adjacent to each column of said charge accumulation regions, said vertical transfer channel transferring the signal charges accumulated in said charge accumulation regions along generally a column direction;
   a vertical transfer electrode formed above said vertical transfer channels for transferring the signal charges accumulated in said charge accumulation regions by controlling a potential of each of said vertical transfer channels;
   a drain of the first conductivity type for sweeping signal charges, said drain being disposed near each of said vertical transfer channels on a downstream side of the column direction of an area of said charge accumulation regions disposed in the matrix shape;
   a gate as a barrier region formed between said drain and a corresponding one of said vertical transfer channels;

an insulating film formed on said drain, said gate and said vertical transfer channel, said insulating film including silicon oxide films and a silicon nitride film, said silicon nitride film covering said vertical transfer channel and extending above said gate excepting a portion near said drain;

a gate control electrode formed on said insulating film for sweeping the signal charges transferred by said vertical transfer channel to said drain; and a horizontal CCD formed on the downstream side of the column direction of an area of said drains, said horizontal CCD transferring the signal charges transferred from said vertical transfer channels along a row direction.

2. The solid state image pickup device according to claim 1, wherein said charge accumulation regions disposed in the matrix shape include first charge accumulation regions disposed in a first square matrix shape and second charge accumulation regions disposed in a second square matrix shape at lattice positions of said first charge accumulation regions disposed in the first square matrix shape.

3. A manufacture method for a solid state image pickup device, comprising steps of:
(a) implanting impurities into a semiconductor substrate to form a plurality of vertical transfer channels of a first conductivity type for transferring electric charges in generally a first direction and to form a drain of the first conductivity type near each of said vertical transfer channels via a gate which forms a barrier;
(b) depositing a first silicon oxide film, a silicon nitride film and a second silicon oxide film in an order from a bottom, on surfaces of said vertical transfer channels, said gates and said drains;
(c) forming a first layer vertical transfer electrode on said second silicon oxide film above said vertical transfer channel,
(d) forming an insulating film on a surface of said first layer vertical transfer electrode;
(e) etching said second silicon oxide film and said silicon nitride film in such a manner that said silicon nitride film covers said vertical transfer channel and extends above said gate excepting a portion near said drain;
(f) forming a gate control electrode on said insulating film and on said first silicon oxide film exposed at said step (e); and
(g) forming a plurality of charge accumulation regions in a matrix shape in an area defined on an upstream side of the first direction further than said drains, in such a manner that each column of said charge accumulation regions is formed near each of said vertical transfer channels.

4. The manufacture method for a solid state image pickup device according to claim 3, further comprising after said step (e) a step of implanting impurities of the first conductivity type into at least a portion of said gate.

5. The manufacture method for a solid state image pickup device according to claim 3, wherein etching at said step (e) is isotropic etching.

6. The manufacture method for a solid state image pickup device according to claim 5, wherein the isotropic etching is chemical dry etching or wet etching.

7. The manufacture method for a solid state image pickup device according to claim 3, wherein etching at said step (e) is anisotropic etching.

8. The manufacture method for a solid state image pickup device according to claim 7, wherein the anisotropic etching at said step (e) is reactive ion etching.

9. The manufacture method for a solid state image pickup device according to claim 3, wherein in said step (g), said plurality of charge accumulation regions are formed in the matrix shape, including a first square matrix and a second square matrix disposed at lattice positions of the first square matrix.

10. The manufacture method for a solid state image pickup device according to claim 3, wherein the first conductivity type is an n-type.

11. A manufacture method for a solid state image pickup device, comprising steps of:
(a) implanting impurities into a semiconductor substrate to form a plurality of vertical transfer channels of a first conductivity type for transferring electric charges in generally a first direction and to form a drain of the first conductivity type near each of said vertical transfer channels via a gate which forms a barrier;
(b) depositing a first silicon oxide film, a silicon nitride film and a second silicon oxide film in an order from a bottom, on surfaces of said vertical transfer channels, said gates and said drains;
(c) anisotropically etching said second silicon oxide film and said silicon nitride film to leave said second silicon oxide film and said silicon nitride film in first and second areas, in said first area, said second silicon oxide film and said silicon nitride film covering said vertical transfer channel and extending above said gate excepting a portion near said drain, and in said second area, said second silicon oxide film and said silicon nitride film covering said drain excepting a peripheral portion of said drain;
(d) forming a first layer vertical transfer electrode on said second silicon oxide film in said first area;
(e) forming an insulating film on a surface of said first layer vertical transfer electrode;
(f) forming a gate control electrode on said insulating film and on said first silicon oxide film between said first and second areas exposed at said step (c); and
(g) forming a plurality of charge accumulation regions in a matrix shape in an area defined on an upstream side of the first direction further than said drains, in such a manner that each column of said charge accumulation regions is formed near each of said vertical transfer channels.

12. The manufacture method for a solid state image pickup device according to claim 11, further comprising after said step (c), (d) or (e) a step of implanting impurities of the first conductivity type into at least a portion of said gate.

13. The manufacture method for a solid state image pickup device according to claim 11, wherein the anisotropic etching at said step (c) is reactive ion etching.

14. The manufacture method for a solid state image pickup device according to claim 11, wherein in said step (g), said plurality of charge accumulation regions are formed in the matrix shape, including a first square matrix and a second square matrix disposed at lattice positions of the first square matrix.

15. The manufacture method for a solid state image pickup device according to claim 11, wherein the first conductivity type is an n-type.

16. A manufacture method for a solid state image pickup device, comprising steps of:
(a) implanting impurities into a semiconductor substrate to form a plurality of vertical transfer channels of a first conductivity type for transferring electric charges in generally a first direction and to form a drain of the first conductivity type near each of said vertical transfer channels via a gate which forms a barrier;
(b) depositing a first silicon oxide film, a silicon nitride film and a second silicon oxide film in an order from a bottom, on surfaces of said vertical transfer channels, said gates and said drains;
(c) forming a first layer vertical transfer electrode on said second silicon oxide film in said first area;
(d) anisotropically etching said second silicon oxide film and said silicon nitride film to leave said second silicon oxide film and said silicon nitride film in first and second areas, in said first area, said second silicon oxide film and said silicon nitride film covering said vertical transfer channel and extending above said gate excepting a portion near said drain, and in said second area, said second silicon oxide film and said silicon nitride film covering said drain excepting a peripheral portion of said drain;
(e) forming an insulating film on a surface of said first layer vertical transfer electrode;
(f) forming a gate control electrode on said insulating film and on said first silicon oxide film between said first and second areas; and
(g) forming a plurality of charge accumulation regions in a matrix shape in an area defined on an upstream side of the first direction further than said drains, in such a manner that each column of said charge accumulation regions is formed near each of said vertical transfer channels.

17. The manufacture method for a solid state image pickup device according to claim 16, further comprising after said step (d) or (e) a step of implanting impurities of the first conductivity type into at least a portion of said gate.

18. The manufacture method for a solid state image pickup device according to claim 16, wherein the anisotropic etching at said step (d) is reactive ion etching.

19. The manufacture method for a solid state image pickup device according to claim 16, wherein in said step (g), said plurality of charge accumulation regions are formed in the matrix shape, including a first square matrix and a second square matrix disposed at lattice positions of the first square matrix.

20. The manufacture method for a solid state image pickup device according to claim 16, wherein the first conductivity type is an n-type.

21. A manufacture method for a solid state image pickup device, comprising steps of:
(a) implanting impurities into a semiconductor substrate to form a plurality of vertical transfer channels of a first conductivity type for transferring electric charges in generally a first direction and to form a drain of the first conductivity type near each of said vertical transfer channels via a gate which forms a barrier;
(b) depositing a first silicon oxide film, a silicon nitride film and a second silicon oxide film in an order from a bottom, on surfaces of said vertical transfer channels, said gates and said drains;
(c) forming a first layer vertical transfer electrode on said second silicon oxide film in said first area;
(d) forming an insulating film on a surface of said first layer vertical transfer electrode;
(e) anisotropically etching said second silicon oxide film and said silicon nitride film to leave said second silicon oxide film and said silicon nitride film in first and second areas, in said first area, said second silicon oxide film and said silicon nitride film covering said vertical transfer channel and extending above said gate excepting a portion near said drain, and in said second area, said second silicon oxide film and said silicon nitride film covering said drain excepting a peripheral portion of said drain;
(f) forming a gate control electrode on said insulating film and on said first silicon oxide film between said first and second areas; and
(g) forming a plurality of charge accumulation regions in a matrix shape in an area defined on an upstream side of the first direction further than said drains, in such a manner that each column of said charge accumulation regions is formed near each of said vertical transfer channels.

22. The manufacture method for a solid state image pickup device according to claim 21, further comprising after said step (e) a step of implanting impurities of the first conductivity type into at least a portion of said gate.

23. The manufacture method for a solid state image pickup device according to claim 21, wherein the anisotropic etching at said step (c) is reactive ion etching.

24. The manufacture method for a solid state image pickup device according to claim 21, wherein in said step (g), said plurality of charge accumulation regions are formed in the matrix shape, including a first square matrix and a second square matrix disposed at lattice positions of the first square matrix.

25. The manufacture method for a solid state image pickup device according to claim 21, wherein the first conductivity type is an n-type.

* * * * *